(12) United States Patent
Dong et al.

(10) Patent No.: US 10,930,681 B2
(45) Date of Patent: Feb. 23, 2021

(54) DISPLAY PANEL WITH FINGERPRINT RECOGNITION AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Xiangdan Dong, Beijing (CN); Youngyik Ko, Beijing (CN)

(73) Assignees: CHENGDU BOE OPTOELECTRONICS TECHNOLOGY CO., LTD., Sichuan (CN); BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 16/371,217

(22) Filed: Apr. 1, 2019

(65) Prior Publication Data

US 2020/0035707 A1   Jan. 30, 2020

(30) Foreign Application Priority Data

Jul. 25, 2018   (CN) .......................... 201810827824.4

(51) Int. Cl.
*H01L 27/12* (2006.01)
*G06K 9/00* (2006.01)
(Continued)

(52) U.S. Cl.
CPC ........ *H01L 27/124* (2013.01); *G06K 9/00053* (2013.01); *H01L 27/156* (2013.01);
(Continued)

(58) Field of Classification Search
CPC ..... H01L 27/124; H01L 27/156; H01L 33/60; H01L 33/62; H01L 27/1248;
(Continued)

(56) References Cited

U.S. PATENT DOCUMENTS

2015/0301382 A1* 10/2015 Ishitani ................ G09G 3/3618
                                                           349/12
2016/0334685 A1* 11/2016 Cao .................... G02F 1/136227
(Continued)

FOREIGN PATENT DOCUMENTS

CN      104808408 A     7/2015
CN      105931987 A     9/2016
(Continued)

OTHER PUBLICATIONS

Office Action corresponding to Chinese Application No. 201810827824.4 dated Apr. 23, 2020.

*Primary Examiner* — Mohammad M Hoque
(74) *Attorney, Agent, or Firm* — Arent Fox LLP; Michael Fainberg

(57) ABSTRACT

The disclosure relates to the field of display technologies, and discloses a display panel and a display device, and the display panel includes: a sensor, a source-drain electrode layer formed on one side of the sensor, and a metal reflecting layer, formed on a side of the source-drain electrode layer away from the sensor, the metal reflecting layer includes a plurality of light-transmitting holes through which light rays for fingerprint recognition are transmitted, and at least two signal lines between which gaps are formed, wherein the display panel further includes a black insulation layer arranged in direct contact with the metal reflecting layer to shield the gaps.

4 Claims, 2 Drawing Sheets

(51) Int. Cl.
  *H01L 27/15*    (2006.01)
  *H01L 33/60*    (2010.01)
  *H01L 33/62*    (2010.01)
  *H01L 51/52*    (2006.01)
  *H01L 27/32*    (2006.01)

(52) U.S. Cl.
  CPC ........ *H01L 27/323* (2013.01); *H01L 27/3234* (2013.01); *H01L 33/60* (2013.01); *H01L 33/62* (2013.01); *H01L 51/5253* (2013.01)

(58) Field of Classification Search
  CPC ............... H01L 27/323; H01L 27/3234; H01L 51/5253; G06K 9/00053; G06K 9/0004; G06K 9/00013; G06F 3/0412; G09G 3/3225
  USPC .......................................................... 257/88
  See application file for complete search history.

(56) References Cited

U.S. PATENT DOCUMENTS

2018/0129852 A1\* 5/2018 Zeng .................... H01L 27/3276
2018/0284927 A1\* 10/2018 Kim .................... H01L 27/3272
2019/0172887 A1   6/2019 Sun et al.
2019/0220644 A1   7/2019 Sun et al.

FOREIGN PATENT DOCUMENTS

| CN | 106940488 A | 7/2017 |
| CN | 107977632 A | 5/2018 |
| CN | 108242462 A | 7/2018 |
| WO | 2014098406 A1 | 6/2014 |

\* cited by examiner

DISPLAY PANEL WITH FINGERPRINT RECOGNITION AND DISPLAY DEVICE

CROSS-REFERENCE TO RELATED APPLICATION

This application claims priority of Chinese Patent Application No. 201810827824.4, filed on Jul. 25, 2018, which is hereby incorporated by reference in its entirety.

FIELD

The present disclosure relates to the field of display technologies, and particularly to a display panel and a display device.

BACKGROUND

At present, a plurality of holes for incident light rays are arranged at a metal reflecting layer in a display panel with a fingerprint recognition function, and a sensor arranged in the display panel sensing the varying light rays.

SUMMARY

Some embodiments of the disclosure provide the following technical solutions.

Some embodiments of the disclosure provide a display panel including: a sensor, a source-drain electrode layer formed on one side of the sensor, and a metal reflecting layer, formed on a side of the source-drain electrode layer away from the sensor, the metal reflecting layer includes a plurality of light-transmitting holes through which light rays for fingerprint recognition are transmitted, and at least two signal lines between which gaps are formed, wherein:

the display panel further includes a black insulation layer arranged in direct contact with the metal reflecting layer to shield the gaps.

Optionally, the source-drain electrode layer is a two-layer structure, wherein:

the source-drain electrode layer includes a first source-drain electrode layer, and a second source-drain electrode layer formed on a side of the first source-drain electrode layer facing the metal reflecting layer, a first interlayer insulation layer is formed between the first source-drain electrode layer and the second source-drain electrode layer, and a second interlayer insulation layer is formed between the second source-drain electrode layer and the metal reflecting layer.

Optionally, the black insulation layer is formed on a metal reflecting layer away from the source-drain electrode layer.

Optionally, the black insulation layer is formed on a side of the metal reflecting layer facing the source-drain electrode layer, the second interlayer insulation layer is made of a black insulation material and formed as the black insulation layer, and the second interlayer insulation layer includes through-holes at positions corresponding to the light-transmitting holes.

Optionally, the source-drain electrode layer is a single-layer structure, and the source-drain electrode layer includes a first source-drain electrode layer.

Optionally, the black insulation layer is formed on a side of the metal reflecting layer away from the first source-drain electrode layer.

Optionally, a first interlayer insulation layer is formed between the first source-drain electrode layer and the metal reflecting layer, the first interlayer insulation layer is made of a black insulation layer and formed as the black insulation layer, and the first interlayer insulation layer includes through-holes at positions corresponding to the light-transmitting holes.

Optionally, the display panel further includes a pixel definition layer formed on a side of the metal reflecting layer away from the source-drain electrode layer.

Optionally, the display panel further includes a buffer layer arranged between the sensor and the source-drain electrode layer.

Some embodiments of this disclosure further provide a display device including the display panel according to any one of the technical solutions above.

DETAILED DESCRIPTION OF THE EMBODIMENTS

The technical solutions according to embodiments of the disclosure will be described below clearly and fully with reference to the drawings in the embodiments of the disclosure, and apparently the embodiments to be described are only a part but not all of the embodiments of the disclosure. Based upon the embodiments here of the disclosure, all the other embodiments which can occur to those ordinarily skilled in the art without any inventive effort shall fall into the claimed scope of the disclosure.

Figure 1:
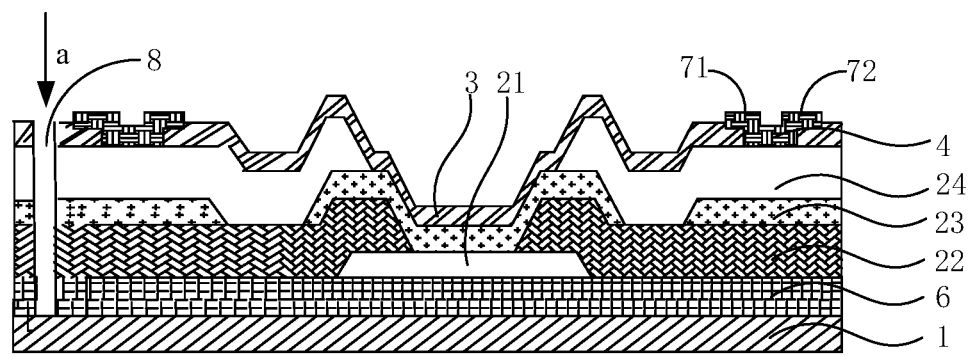
FIG. 1 is a schematic structural diagram of a display panel according to some embodiments of the disclosure.

Referring to FIG. 1, an embodiment of the disclosure provides a display panel including a sensor 1, a source-drain electrode layer formed on one side of the sensor 1, and a metal reflecting layer 3, formed on the side of the source-drain electrode layer away from the sensor 1, the metal reflecting layer 3 including a plurality of light-transmitting holes 8 through which light rays for fingerprint recognition are transmitted, and at least two signal lines 71, 72 between which gaps are formed; and the display panel further includes a black insulation layer 4 arranged in direct contact with the metal reflecting layer 3 to shield the gaps.

In the display panel above, the display panel includes the sensor 1, the source-drain electrode layer formed on one side of the sensor 1, the metal reflecting layer 3 formed on the side of the source-drain electrode layer away from the sensor 1, and the black insulation layer 4, where the gaps formed between the at least two signal lines at the metal reflecting layer 3 are shielded by the black insulation layer 4. In an application of the display panel above, the sensor 1 can receive the light rays entering through the plurality of light-transmitting holes at the metal reflecting layer 3 (light rays a in FIG. 5, for example) to recognize a fingerprint of a user, and it shall be noted that in the existing display panel, ambient light rays incident on the gaps formed between the at least two signal lines at the metal reflecting layer enter the sensor 1, thus hindering the fingerprint from being recognized; and in the display panel according to the embodiment of the disclosure, the gaps are shielded by the black insulation layer 4, so the ambient light rays shielded by the black insulation layer 4 cannot enter the sensor 1 thought the gaps. Moreover the black insulation layer 4 is directly contact with the metal reflecting layer 3, and there is no reflection gap between them, thus further lowering the possibility that the ambient light rays enter the sensor 1.

In the display panel according to some embodiments of the disclosure, the gaps at the metal reflecting layer 3 are shielded by the black insulation layer 4, that is, the precision of recognition effect of the display panel can be improved due to the light-shielding effect of the black insulation layer 4 (other than some light-transmitting holes).

Accordingly the display panel above is arranged with the black insulation layer 4 to thereby avoid the ambient light rays from entering the sensor 1 through the gaps at the metal reflecting layer 3 so as to improve the effect of fingerprint recognition in the display effect.

Further to the technical solution above, it shall be noted that there are a plurality of implementations of the structure of source-drain electrode layer in the display panel in the display panel according to embodiments of the disclosure, where the structure can be one of at least the following two implementations.

In a first implementation, the source-drain electrode layer is a two-layer structure.

Optionally, the source-drain electrode layer includes a first source-drain electrode layer 21, and a second source-drain electrode layer 23 formed on the side of the first source-drain electrode layer 21 facing the metal reflecting layer 3, a first interlayer insulation layer 22 is formed between the first source-drain electrode layer 21 and the second source-drain electrode layer 23, and a second interlayer insulation layer 24 is formed between the second source-drain electrode layer 23 and the metal reflecting layer 3.

Further to the technical solution in the first implementation, there are a plurality of instances of the particular structure of the black insulation layer 4, where the instances can include one of at least the following two instances.

In a first instance, further referring to FIG. 1, the black insulation layer 4 is formed on the side of the metal reflecting layer 3 away from the source-drain electrode layer.

Optionally, the gaps formed between the different signal lines at the metal reflecting layer 3 are shielded by the black insulation layer 4 formed on the side of the metal reflecting layer 3 away from the source-drain electrode layer, so ambient light rays cannot enter the sensor 1 through the gaps, and the ambient light rays are shielded by the black insulation layer 4.

Figure 2:
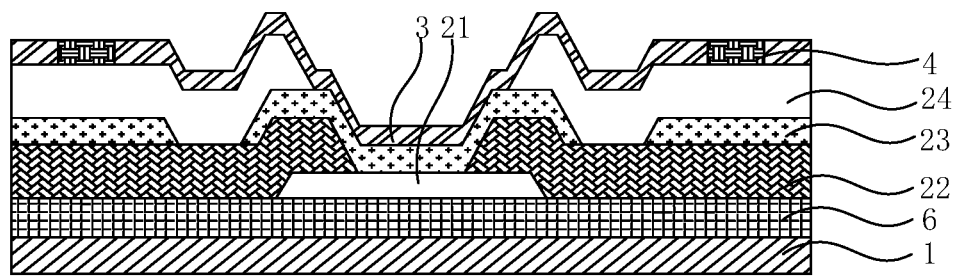
FIG. 2 is another schematic structural diagram of the display panel according to some embodiments of the disclosure.

It shall be noted that referring to FIG. 2, the black insulation layer 4 can be arranged at the same layer as the metal reflecting layer 3, i.e., filled in the gaps at the metal reflecting layer 3.

Figure 3:
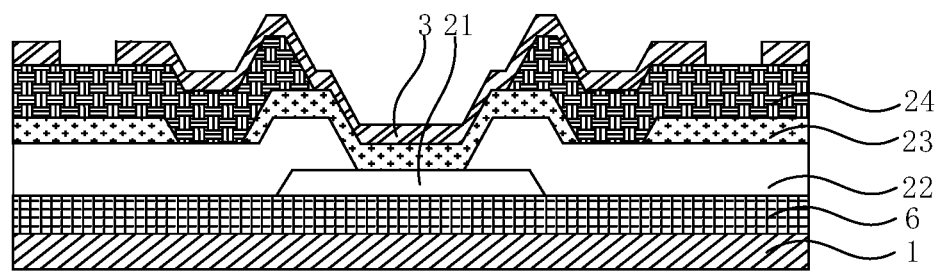
FIG. 3 is a further schematic structural diagram of the display panel according to some embodiments of the disclosure.

In a second instance, referring to FIG. 3, the black insulation layer 4 is formed on the side of the metal reflecting layer 3 facing the source-drain electrode layer, the second interlayer insulation layer 24 is made of a black insulation material, and formed as the black insulation layer 4, and there are through-holes at the second interlayer insulation layer 24 at positions corresponding to the light-transmitting holes.

Optionally, when the ambient light rays are emitted into the display panel through the gaps formed between the different signal lines at the metal reflecting layer 3, since the second interlayer insulation layer 24 made of the black insulation material is formed on the side of the metal reflecting layer 3 facing the sensor 1, the second interlayer insulation layer 24 can prevent the ambient light rays from further moving, and thus shield the ambient light rays to thereby improve the precision of fingerprint recognition.

In a second implementation, the source-drain electrode layer is a single-layer structure, that is, the source-drain electrode layer includes a first source-drain electrode layer 21.

It shall be noted that when the source-drain electrode layer is a single-layer structure, it can be fabricated using less masks to thereby lower the complexity of the process.

Further to the technical solution in the second implementation, there are a plurality of instances of the particular structure of the black insulation layer 4, where the instances can include one of at least the following two instances.

Figure 4:
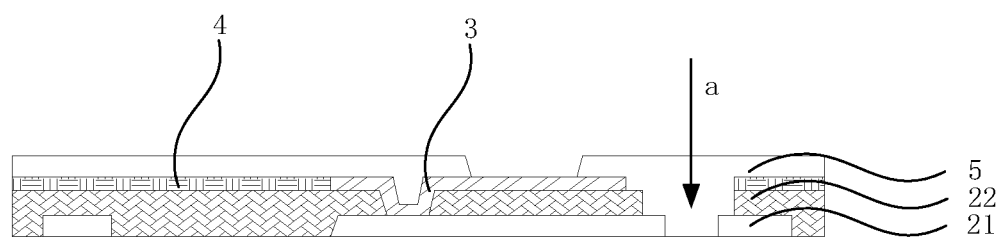
FIG. 4 is a further schematic structural diagram of the display panel according to some embodiments of the disclosure.

In a third instance, referring to FIG. 4, the black insulation layer 4 is formed on the side of the metal reflecting layer 3 away from the first source-drain electrode layer 21.

Optionally, the gaps formed between the different signal lines at the metal reflecting layer 3 are shielded by the black insulation layer 4 formed on the side of the metal reflecting layer 3 away from the first source-drain electrode layer 21, so ambient light rays cannot enter the sensor 1 through the gaps, and the ambient light rays are shielded by the black insulation layer 4.

Figure 5:
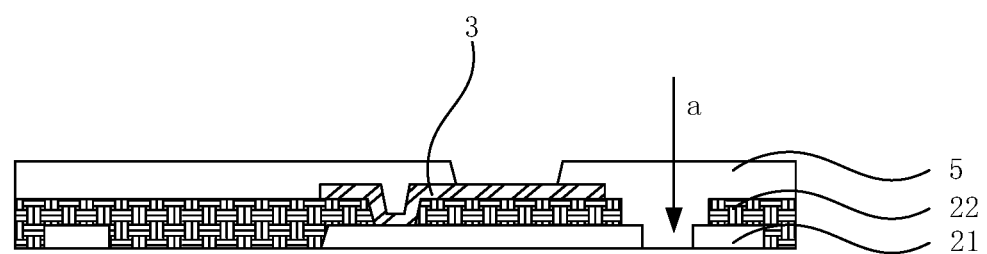
FIG. 5 is a further schematic structural diagram of the display panel according to some embodiments of the disclosure.

In a fourth instance, referring to FIG. 5, a first interlayer insulation layer 22 is formed between the first source-drain electrode layer 21 and the metal reflecting layer 3, the first interlayer insulation layer 22 is made of a black insulation layer, and formed as the black insulation layer 4, and there are through-holes at the first interlayer insulation layer 22 at positions corresponding to the light-transmitting holes.

Optionally, when the ambient light rays are emitted into the display panel through the gaps formed between the different signal lines at the metal reflecting layer 3, since the first interlayer insulation layer 22 made of the black insulation material is formed on the side of the metal reflecting layer 3 facing the sensor 1, the first interlayer insulation layer 22 can prevent the ambient light rays from further moving, and thus shield the ambient light rays to thereby improve the precision of fingerprint recognition.

Further to the technical solution above, the material of the black insulation layer 4 can be polyimide.

Further to the technical solution above, further referring to FIG. 5, the display panel according to embodiments of the disclosure further includes a pixel definition layer 5 formed on the side of the metal reflecting layer 3 away from the source-drain electrode layer.

It shall be noted that the material of the pixel definition layer 5 is a transparent material.

Further to the technical solution above, in order to fabricate the source-drain electrode layer, further referring to FIG. 1, the display panel according to embodiments of the disclosure optionally further includes a buffer layer 6 arranged between the sensor 1 and the source-drain electrode layer.

An embodiment of the disclosure further provides a display device including the display panel according to any one of the technical solutions above.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display panel, comprising: a sensor, a source-drain electrode layer formed on one side of the sensor, and a metal reflecting layer formed on a side of the source-drain electrode layer away from the sensor, the metal reflecting layer comprises a plurality of light-transmitting holes through which light rays for fingerprint recognition are transmitted, and at least two signal lines between which gaps are formed, wherein:

the display panel further comprises a black insulation layer arranged in direct contact with the metal reflecting layer to shield the gaps;

wherein the source-drain electrode layer is a two-layer structure, wherein:

the source-drain electrode layer comprises a first source-drain electrode layer and a second source-drain electrode layer formed on a side of the first source-drain electrode layer facing the metal reflecting layer, a first interlayer insulation layer is formed between the first source-drain electrode layer and the second source-drain electrode layer, and a second interlayer insulation layer is formed between the second source-drain electrode layer and the metal reflecting layer;

wherein the black insulation layer is formed on a side of the metal reflecting layer away from the source-drain electrode layer.

2. The display panel according to claim 1, further comprises a buffer layer arranged between the sensor and the source-drain electrode layer.

3. A display device, comprising the display panel according to claim 1.

4. The display device according to claim 3, wherein the display panel further comprises a buffer layer arranged between the sensor and the source-drain electrode layer.

* * * * *